(12) United States Patent
Liu et al.

(10) Patent No.: US 6,251,694 B1
(45) Date of Patent: Jun. 26, 2001

(54) METHOD OF TESTING AND PACKAGING A SEMICONDUCTOR CHIP

(75) Inventors: Hermen Liu, Taoyuan; Yimin Huang, Tai-Chung Hsien, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/318,597

(22) Filed: May 26, 1999

(51) Int. Cl.$^7$ .................................................. H01L 31/26
(52) U.S. Cl. .............................................. 438/14; 436/612
(58) Field of Search .................... 438/14, 17, 18, 438/613, 614, 612, 617, 15

(56) References Cited

U.S. PATENT DOCUMENTS

| | | | |
|---|---|---|---|
| 4,761,386 | * 8/1988 | Buynoski | 438/15 |
| 5,134,460 | * 7/1992 | Brady et al. | 357/71 |
| 5,585,282 | * 12/1996 | Wood et al. | 438/613 |
| 5,665,639 | * 9/1997 | Seppala et al. | 438/15 |
| 5,731,636 | * 3/1998 | Chun | 257/784 |
| 5,736,456 | * 4/1998 | Akram | 438/614 |
| 5,793,117 | * 8/1998 | Shimada et al. | 257/780 |
| 5,795,818 | * 8/1998 | Marrs | 438/612 |
| 5,855,993 | * 1/1999 | Brady et al. | 428/209 |
| 6,030,890 | * 2/2000 | Iwabuchi | 438/613 |

* cited by examiner

Primary Examiner—David Nelms
Assistant Examiner—David Nhu
(74) Attorney, Agent, or Firm—Winston Hsu

(57) ABSTRACT

The present invention provides a method of testing and packaging a semiconductor chip. The semiconductor chip includes an integrated circuit (IC) positioned within the semiconductor chip, and a bonding pad positioned on the surface of the semiconductor chip and electrically connected with the IC. The method includes using a probe to contact a predetermined testing area on the surface of the bonding pad to electrically test the IC, and forming a passivation layer on the surface of the semiconductor chip to passivate the surface of the semiconductor chip. The testing area of the bonding pad is covered under the passivation layer and the passivation layer has an opening positioned on the bonding pad outside the testing area which is used as a connecting area for performing wire bonding or bumping.

9 Claims, 5 Drawing Sheets

METHOD OF TESTING AND PACKAGING A SEMICONDUCTOR CHIP

BACKGROUND OF THE INVENTION

1. Field of the Invention

The present invention relates to a method of testing and packaging, and more particularly, to a method of testing and packaging a semiconductor chip.

2. Description of the Prior Art

In semiconductor processing, the formation of the passivation layer formed of electrical isolation material on the semiconductor chip is followed as integrated circuits (ICs) within the semiconductor chip and the metallic layer on the surface of the integrated circuits are prepared. Also, openings are made in the passivation layer for allowing the exposure of the underlying metallic layer to function as the bonding pad. Electrical testing can then be performed for selecting out the qualified semiconductor chips those will undergo the packaging process. During testing, a probe is placed in contact with the surface of the bonding pad to electrically test the ICs within the semiconductor chip. Metallic wire bonding is then performed on those passing the electrical testing thus connecting the semiconductor chips to external components. However, the probe must make contact with the bonding pad for performing the electrical testing so a probe mark is often left on the bonding pad of the semiconductor chip. If the probe mark is very deep, peeling occurs during metallic wire bonding. This reduces the reliability of the packaging process.

Please refer to FIG. 1 and FIG. 2. FIG. 1 is a top view of a bonding pad 12 on a semiconductor chip 10 according to the prior art. FIG. 2 is a sectional schematic diagram of the bonding pad 12 shown in FIG. 1. After all metallic interconnections and the metallic layer employed as the bonding pad on the semiconductor chip 10 are completed and the circuits are defined, a passivation layer 14 is deposited on the semiconductor chip 10. A hole 16 is then formed on the passivation layer 14 by performing the photolithography and the dry-etching process. After bonding pad processing is complete, the semiconductor chip 10 contains a plurality of bonding pads 12 on its surface and a passivation layer 14 deposited on the bonding pads 12. The passivation layer 14 comprises a plurality of holes 16 separately positioned above each bonding pad 12 thus exposing the metal layer. These holes 16 serve as the testing area of the ICs within the semiconductor chip 10 as well as the connecting area of the metallic wire bonding.

Please refer to FIG. 3. FIG. 3 is a sectional schematic diagram of the bonding pad 12 shown in FIG. 2 after testing. After the bonding pad 12 is completely formed, the electrical testing is performed. A probe is used to contact with the portion of the bonding pad 12 not covered by the passivation layer 14 through the hole 16 for electrically testing the Ics within the semiconductor chip 10. As a result, the qualified semiconductor chips 10 are selected out to be performed the packaging process on later. However, a probe mark 18 remains on the bonding pad 12 where the probe had originally made contact.

Please refer to FIG. 4. FIG. 4 is a schematic diagram of the bonding pad 12 shown in FIG. 3 for bonding to a metallic wire. After successful testing of the semiconductor chip 10, a packaging process is performed in which a metallic wire is attached to the bonding pad 12. When bonding a metallic wire, the rearface of the semiconductor chip 10 is fixed to a baseplate 20 firstly. Next, a metallic ball 24 is formed at one end of the metallic wire 22 and bonded to the exposed metal of the bonding pad 12. The other end of the metallic wire 22 is then dragged to the baseplate 20 and bonded to the predetermined area of the baseplate 20 thus linking the signals of the semiconductor chip 10 to the exterior. The resultant probe mark 18 on the surface of the bonding pad 12 interferes with the adherence of the metallic ball 24 to the bonding pad 12. Also, dragging of the metallic wire 22 may cause the metallic ball 24 to peel from the surface of the bonding pad 12 and even remove part of the metal of the bonding pad 12 with it. This not only causes damage to the surface of the semiconductor chip 10 but also reduces the reliability of the packaging process.

SUMMARY OF THE INVENTION

It is therefore a primary objective of the present invention to provide a method of testing and packaging a semiconductor chip for preventing the metal of the bonding pad peeling.

In a preferred embodiment, the present invention provides a method of testing and packaging a semiconductor chip, the semiconductor chip comprising an integrated circuit (IC) positioned within the semiconductor chip, and a bonding pad positioned on the surface of the semiconductor chip and electrically connected with the IC, the method comprising:

using a probe to contact a predetermined testing area on the surface of the bonding pad to electrically test the IC; and forming a passivation layer on the surface of the semiconductor chip to passivate the surface of the semiconductor chip wherein the testing area of the bonding pad is covered under the passivation layer and the passivation layer comprises an opening positioned on the bonding pad outside the testing area which is used as a connecting area for performing wire bonding or bumping.

It is an advantage of the present invention that the testing area is distinct from the connecting area so that the peeling phenomenon caused by the probe mark can be avoided.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 5:
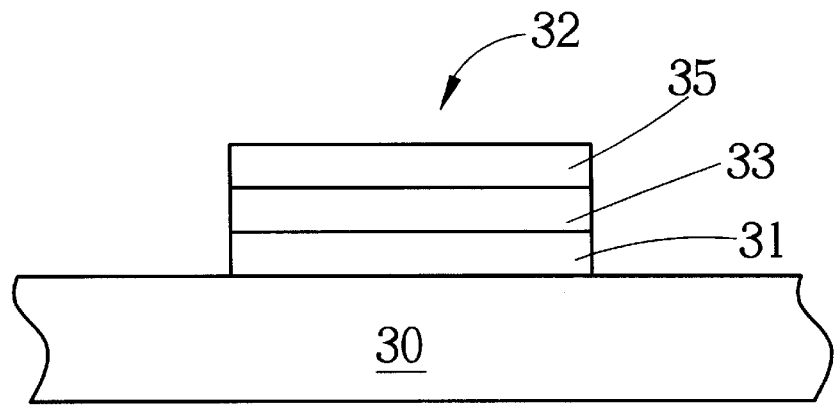
FIG. 5 to FIG. 9 are schematic diagrams of a method of testing and packaging a bonding pad of a semiconductor chip according to the present invention.

Please refer to FIG. 5 to FIG. 9. FIG. 5 to FIG. 9 are schematic diagrams of a method of testing and packaging a bonding pad 32 of a semiconductor chip 30 according to the present invention. As shown in FIG. 5, the semiconductor chip 30 comprises an integrated circuit (IC) (not shown) positioned within the semiconductor chip 30, and a bonding pad 32 positioned on the surface of the semiconductor chip 30. The bonding pad 32 is electrically connected to the IC. The bonding pad 12 comprises a glue layer 31 formed of titanium (Ti), an aluminum alloy 33 layer, and an anti-reflection layer 35 formed of titanium nitride (TiN). The glue layer 31 is positioned on the semiconductor chip 30, the aluminum alloy layer 33 is on the glue layer 31 and the anti-reflection layer 35 is on the aluminum alloy layer 33. The aluminum alloy layer 33 is formed of aluminum and copper with more than 95% of aluminum by weight.

Figure 6:
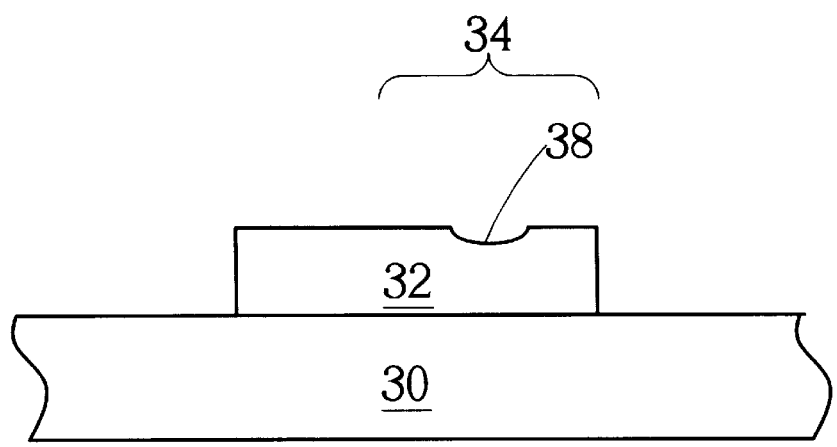
Figure 7:
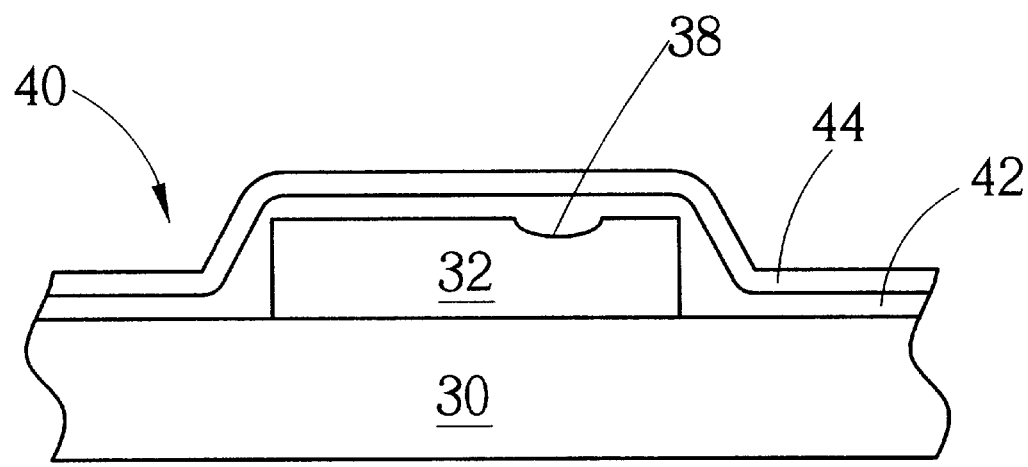

Next, a probe is brought into contact with a predetermined testing area 34 on the surface of the bonding pad 32 to electrically test the IC of the semiconductor chip 30. After electrical testing, a depressed print 38 is left in the testing area 34 on the surface of the bonding pad 32 as shown in FIG. 6. A passivation layer 40 is then formed on the surface of the semiconductor chip 30 as shown in FIG. 7. The passivation layer 40 comprises an inorganic passivation layer 42 formed of phosphosilicate glass (PSG) or silicon nitride positioned on the surface of the semiconductor chip 30 and an organic passivation layer 44 formed of polyimide positioned on the inorganic passivation layer 42.

Figure 8:
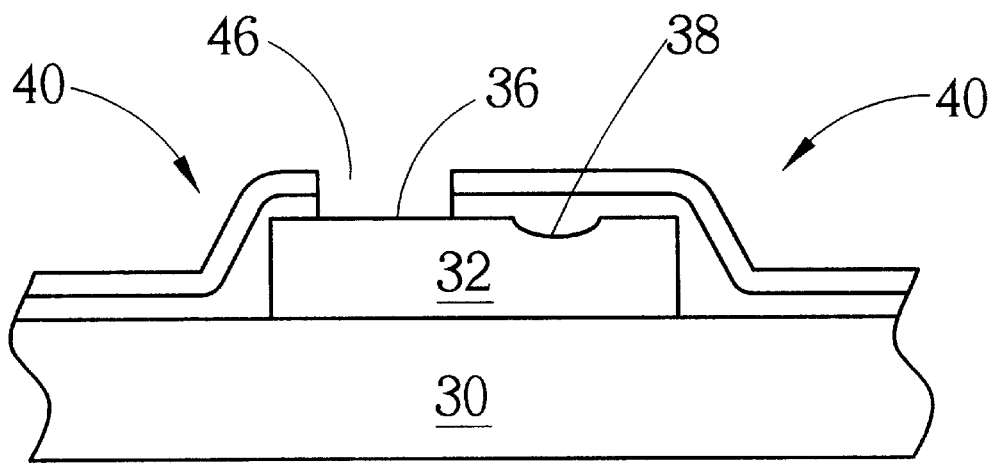
Figure 9:
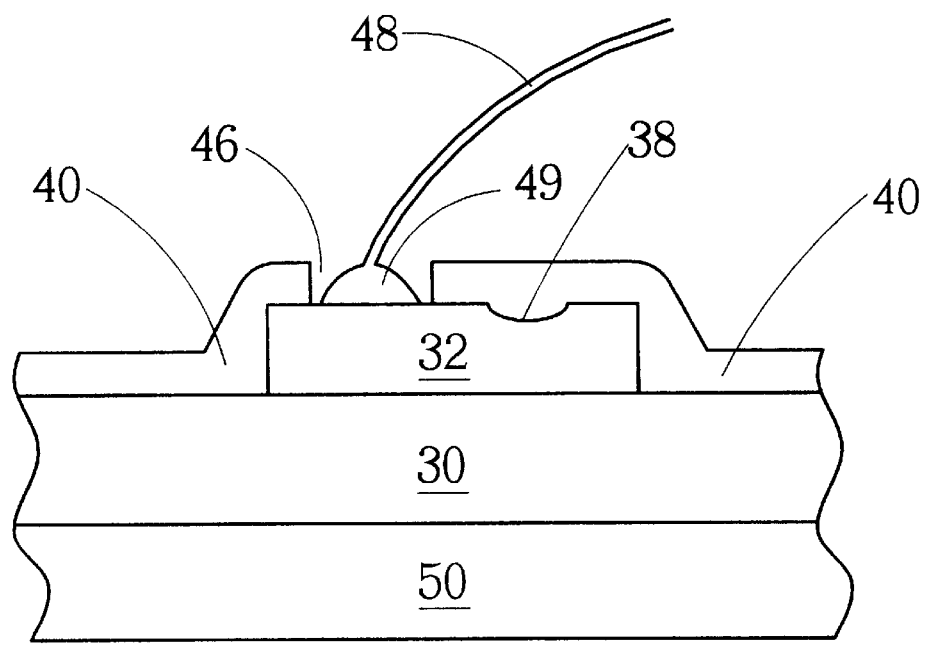

Next, lithography and dry-etching process is performed on the passivation layer 40 of the semiconductor chip 30. The dry-etching process is performed by injecting a mixed gas at a low pressure. The mixed gas comprises sulfur hexafluoride ($SF_6$), fluoroform ($CHF_3$), and carbon tetrafluoride ($CF_4$). Etching is accomplished using plasma to form the passivation layer 40 with an opening 46 for passivating the surface of the semiconductor chip 30 as shown in FIG. 8. The testing area 34 of the surface of the bonding pad 32 is covered by the passivation layer 40. The opening 46 is located on the surface of the bonding pad 32 and does not overlap with the testing area 34. The area of the opening 46 is used as the connecting area 36 for wire bonding. Finally, metallic wire bonding is performed as shown in FIG. 9. When the semiconductor chip 30 is fixed to the baseplate 50, the metallic ball 49 at one end of the metallic wire 48 is bonded to the opening 46 on the surface of the bonding pad 32. Next, the other end of the metallic wire 48 is dragged to the predetermined area on the baseplate 50 and bonded there so that the signals in the semiconductor chip 30 can be connected with the exterior.

Figure 1:
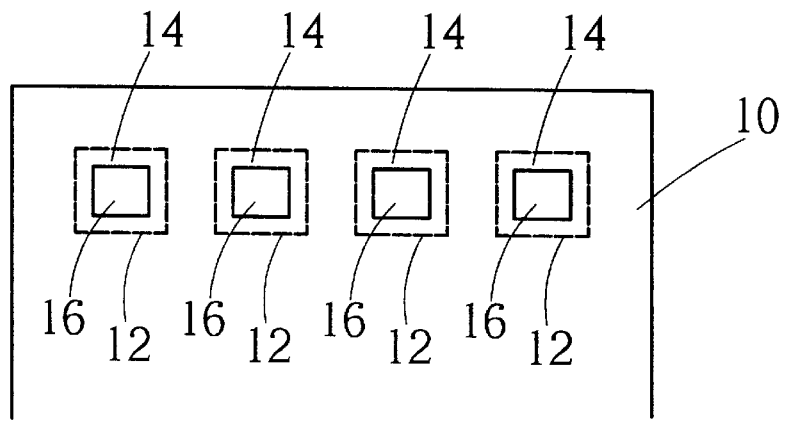
FIG. 1 is a top view of a bonding pad on a semiconductor chip according to the prior art.
Figure 2:
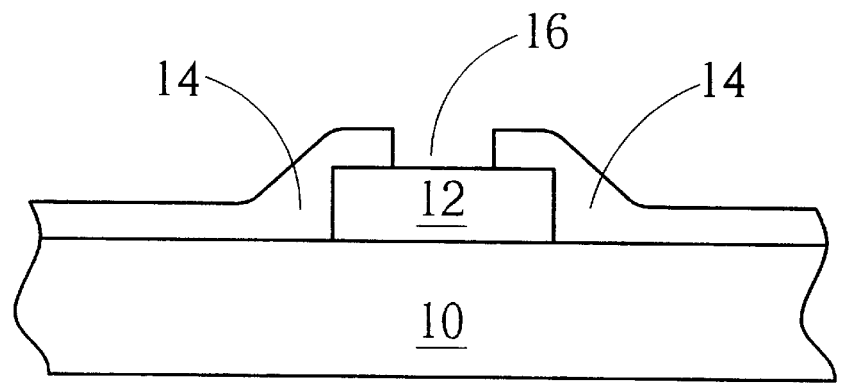
FIG. 2 is a sectional schematic diagram of the bonding pad shown in FIG. 1.
Figure 3:
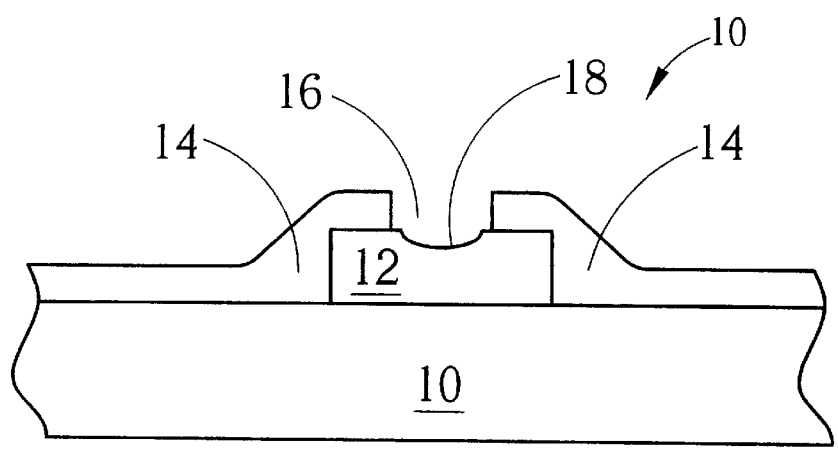
FIG. 3 is a sectional schematic diagram of the bonding pad shown in FIG. 2 after testing.
Figure 4:
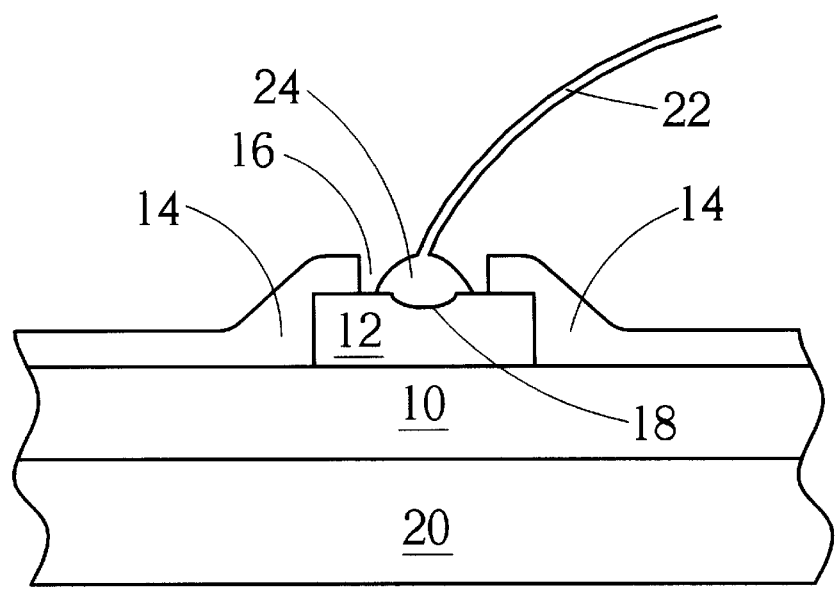
FIG. 4 is a schematic diagram of the bonding pad 12 shown in FIG. 3 for bonding to a metallic wire.
Figure 10:
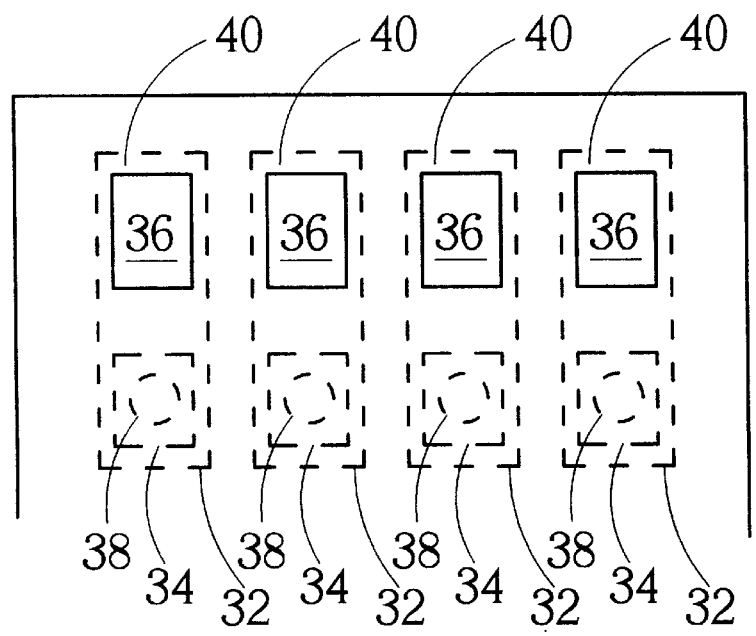
FIG. 10 is a top view of the semiconductor chip shown in FIG. 8.

Please refer to FIG. 10. FIG. 10 is a top view of the semiconductor chip 30 shown in FIG. 8. In the method of testing and packaging the semiconductor chip 30 of the present invention, the electrical testing on the testing area 34 of the bonding pad 32 is first performed followed by deposition of the passivation layer 40 over the surface of the semiconductor chip 30. This passivation layer 40 covers the testing area 34, which has a probe mark, and produces an opening 46 on a separate area of the surface of the bonding pad 32. This opening 46 serves as a connecting area 36 for wire bonding. There is a plurality of prolonged bonding pads 32 installed on the surface of the semiconductor chip 30 and a passivation layer 40 with openings 46 deposited on each bonding pad 32 to expose the metal of the bonding pad 32. In this way, this area can be used as the connecting area 36 for wire bonding. In the prior art in the FIG. 2, the testing area is also the connecting area in semiconductor chip 10. However, the testing area 34 of the bonding pad 32 and the connecting area 36 of the present invention as shown in FIG. 10 are distinct from one another and do not overlap. The testing area 34 is covered by the passivation layer 40 before performing metallic wire bonding to prevent metallic wire bonding on areas of the bonding pad 32 containing probe marks. Metallic wire bonding can be optimally accomplished when there are no probe marks on the bonding pad 32. Therefore, with no probe marks on the bonding pad 32, there is no peeling and the packaging process reliability is thus enhanced.

Figure 11:
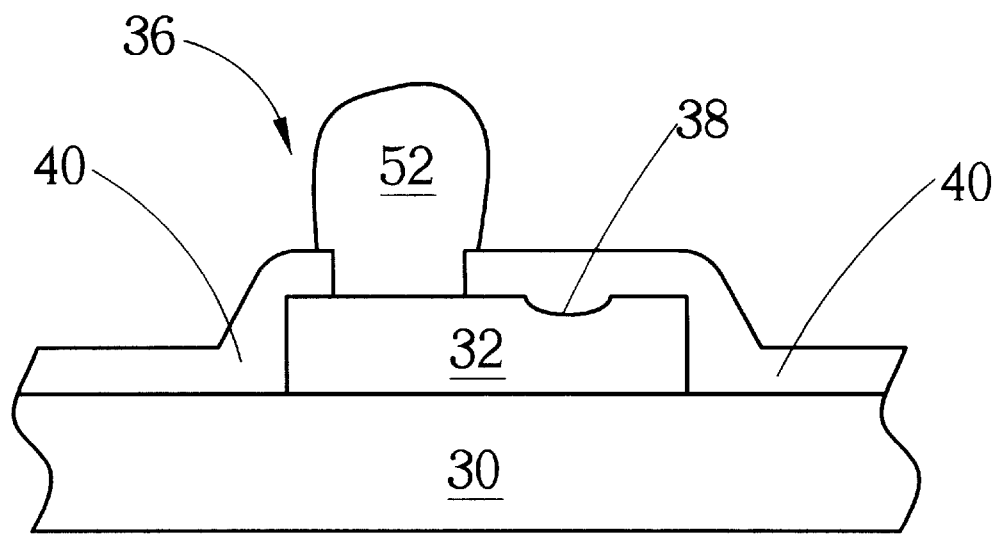
FIG. 11 and FIG. 12 are schematic diagrams of an alternative embodiment according to the present invention.
Figure 12:
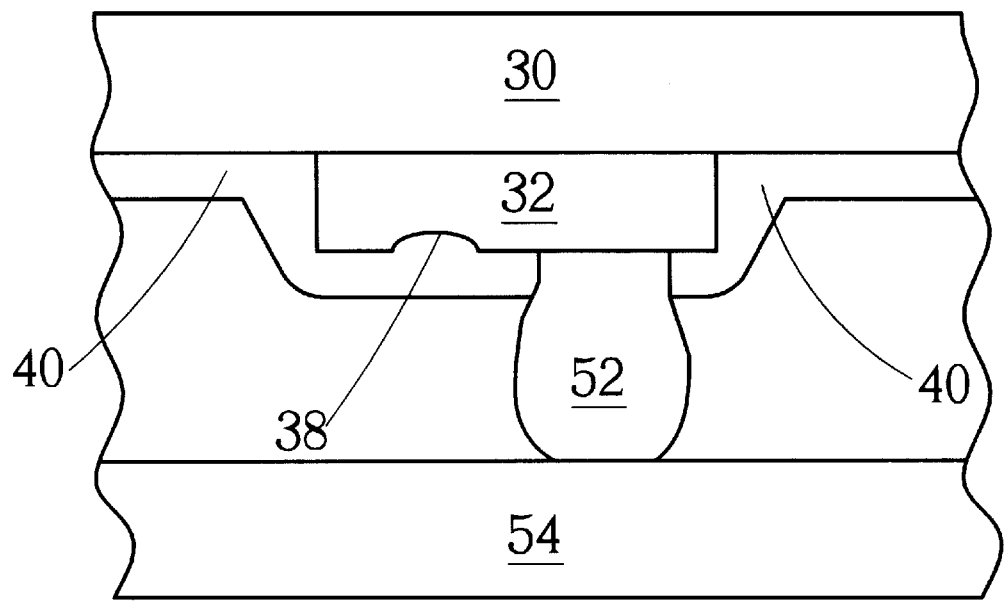

Please refer to FIG. 11 and FIG. 12. FIG. 11 and FIG. 12 are sectional schematic diagrams of an alternative embodiment of a flip semiconductor chip according to the present invention. The testing and packaging method of the present invention can also be utilized in a flip semiconductor chip process. When the bonding pad 32 of the semiconductor chip 30 is completed according to the technology of the present invention, those semiconductor chips passing the test will undergo the flip semiconductor chip process. As shown in FIG. 11, a metallic bump 52 is first formed on the connecting area 36 of the bonding pad 32 and then the semiconductor chip 30 is inverted so that the metallic bump 52 is bonded to the baseplate 54. After the metallic bump 52 is melted, the semiconductor chip 30 will become fixed on the baseplate 54, as shown in FIG. 11. Because the connecting area 36 does not overlap with the testing area 34 and the bump 52 does not form on the probe mark 38 of the bonding pad 32, peeling does not occur and bumping uniformity is maintained.

Compared to the prior method of testing and packaging the bonding pad 12, in the method of testing and packaging the bonding pad 32 of the present invention, an electrical testing is firstly performed in the testing area 34 to test the IC of semiconductor chip 30 before forming a passivation layer 40. Then, a passivation layer 40 is formed with openings 46 on the surface of the semiconductor chip 30. The opening 46 does not overlap with the testing area 34 of the surface of the bonding pad 32 and is used as a connecting area 36 for performing wire bonding or bumping. With use of this method, the peeling phenomenon caused by probe marks formed during the packaging process is prevented.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of testing and packaging a semiconductor chip, the semiconductor chip comprising an integrated circuit (IC) positioned within the semiconductor chip, and a bonding pad positioned on the surface of the semiconductor chip and electrically connected with the IC, the method comprising:

using a probe to contact a predetermined testing area on the surface of the bonding pad to electrically test the IC; and forming a passivation layer on the surface of the semiconductor chip to passivate the surface of the semiconductor chip wherein the testing area of the bonding pad is covered under the passivation layer and the passivation layer comprises an opening positioned on the bonding pad outside the testing area which is used as a connecting area for performing wire bonding or bumping.

2. The method of claim 1 wherein the bonding pad is a metallic layer formed of aluminum (Al), copper (Cu) or alloy of aluminum.

3. The method of claim 2 wherein the alloy is formed of aluminum and copper with more than 95% of aluminum by weight.

4. The method of claim 1 wherein the bonding pad comprises a glue layer formed of titanium (Ti) positioned on the surface of the semiconductor chip, an aluminum alloy layer positioned on the glue layer, and an anti-reflection layer formed of titanium nitride (TiN) positioned on the surface of the aluminum alloy layer.

5. The method of claim 1 wherein the passivation layer comprises an inorganic passivation layer positioned on the surface of the semiconductor chip and an organic passivation layer positioned on the inorganic passivation layer.

6. The method of claim 5 wherein the inorganic passivation layer is formed of phosphosilicate glass (PSG) or silicon nitride.

7. The method of claim 5 wherein the organic passivation layer is formed of polyimide.

8. The method of claim 1 wherein the opening is formed by performing photolithographic and dry etching processes.

9. The method of claim 8 wherein the dry etching process is performed by injecting a mixed gas at a low pressure over which the mixed gas comprises sulfur hexafluoride ($SF_6$), fluoroform ($CHF_3$), and carbon tetrafluoride ($CF_4$).

* * * * *